(12) United States Patent
Lee et al.

(10) Patent No.: US 6,794,263 B1
(45) Date of Patent: Sep. 21, 2004

(54) METHOD OF MANUFACTURING A SEMICONDUCTOR DEVICE INCLUDING ALIGNMENT MARK

(75) Inventors: Kong-Soo Lee, Gyeonggi-do (KR); Young-Wook Park, Suwon (KR); Jae-Jong Han, Seoul (KR); Gi-Hyun Hwang, Yongin (KR); Kyoung-Seok Kim, Seoul (KR); Sung-Eui Kim, Suwon (KR); Seung-Mok Shin, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/367,931

(22) Filed: Feb. 19, 2003

(30) Foreign Application Priority Data

Feb. 19, 2002 (KR) ................. 10-2002-0008804

(51) Int. Cl.⁷ ..................... H01L 21/76; H01L 21/302
(52) U.S. Cl. .................. 438/401; 438/424; 438/692; 438/975; 438/959
(58) Field of Search .................... 438/401, 424, 438/437, 692, 296, 462, 975

(56) References Cited

U.S. PATENT DOCUMENTS

| 5,966,614 | A | * | 10/1999 | Park et al. ............ 438/401 |
| 5,998,288 | A | * | 12/1999 | Gardner et al. ........ 438/589 |
| 6,087,233 | A | * | 7/2000 | Roh .................... 438/296 |
| 6,534,378 | B1 | * | 3/2003 | Ramkumar et al. ...... 438/401 |

* cited by examiner

*Primary Examiner*—John F. Niebling
*Assistant Examiner*—Ron Pompey
(74) *Attorney, Agent, or Firm*—Lee & Sterba, P.C.

(57) ABSTRACT

A method of inhibiting pit occurrence on a semiconductor substrate during manufacture of a semiconductor device includes forming an isolation using a shallow trench isolation (STI) method in a semiconductor substrate, forming an insulation layer on an entire surface of the semiconductor substrate having the isolation, implanting ions into the semiconductor substrate using the insulation layer as a buffer layer, annealing the semiconductor substrate using a rapid thermal annealing (RTA) process, forming a photoresist layer on the insulation layer and then forming an opening in the photoresist layer to expose an underlayer thereof, forming an align key by etching the underlayer at the opening, and removing the photoresist layer and the insulation layer. Alternatively, the thickness of the insulation layer may be reduced to prevent the occurrence of pits on active areas of the semiconductor substrate.

6 Claims, 13 Drawing Sheets

|    |    |    |    |    | 2  | 6  | 8   | 10 | 3  |    |    |    |
|----|----|----|----|----|----|----|-----|----|----|----|----|----|
|    |    |    |    |    | 14 | 15 | 16  | 21 | 11 |    |    |    |
|    |    |    |    |    | 14 | 19 | 33  | 35 | 34 |    |    |    |
|    |    |    |    |    | 38 | 41 | 0   | 0  | 46 |    |    |    |
|    |    | 5  | 30 | 44 | 51 | 57 | 50  | 56 | 61 | 63 | 56 | 21 |
|    |    | 1  | 33 | 48 | 34 | 58 | 47  | 55 | 56 | 44 | 55 | 32 |
|    |    | 21 | 40 | 72 | 46 | 48 | 63  | 72 | 52 | 59 | 90 | 55 |
|    |    | 32 | 38 | 35 | 41 | 57 | 56  | 52 | 65 | 53 | 55 | 51 |
|    | 17 | 29 | 35 | 49 | 55 | 44 | 67  | 55 | 58 | 70 | 48 | 60 | 33 |
|    | 24 | 28 | 36 | 42 | 0  | 49 | 48  | 46 | 62 | 47 | 67 | 48 | 38 |
|    | 16 | 33 | 35 | 30 | 43 | 44 | 52  | 51 | 54 | 51 | 44 | 45 | 45 |
|    | 12 | 28 | 35 | 35 | 47 | 43 | 51  | 53 | 42 | 56 | 44 | 43 | 43 |
| 15 | 12 | 22 | 40 | 42 | 36 | 52 | 28  | 47 | 65 | 63 | 47 | 39 | 32 | 45 |
| 7  | 11 | 18 | 28 | 32 | 37 | 39 | 39  | 51 | 61 | 52 | 41 | NaN| 29 | 18 |
| 4  | 8  | 19 | 25 | 0  | 32 | 31 | 38  | 42 | 35 | 39 | 39 | 25 | 16 | 7 |
| 2  | 3  | 6  | 9  | 17 | 0  | 28 | 33  | 39 | 38 | 44 | 30 | 18 | 18 | 2 |
|    | 3  | 4  | 22 | 23 | 18 | 23 | 35  | 36 | 29 | 26 | 23 | 9  | 3  |
|    | 2  | 4  | 9  | 16 | 15 | 25 | 24  | 35 | 24 | 20 | 7  | 6  | 1  |
|    | 2  | 1  | 2  | 10 | 15 | 13 | 24  | 21 | 18 | 16 | 2  | 1  | 1  |
|    | 4  | 3  | 2  | 3  | 8  | 20 | 11  | 17 | 13 | 5  | 6  | 1  | 1  |
|    |    | 4  | 0  | 12 | 6  | 4  | 10  | 0  | 7  | 1  | 4  | 0  |
|    |    | 1  | 1  | 1  | 4  | 3  | 1   | 360| 2  | 0  | 2  | 2  |
|    |    | 1  | 1  | 2  | 0  | 0  | 1   | 1  | 0  | 1  | 1  | 5  |
|    |    | 1  | 1  | 22 | 0  | 1  | 0   | 1  | 2  | 2  | 1  | 4  |
|    |    |    |    |    | 13 | 2  | 3   | 0  | 3  |    |    |    |
|    |    |    |    |    | 3  | 1  | 1   | 2  | 2  |    |    |    |
|    |    |    |    |    | 1  | 1  | 879 | 3  | 3  |    |    |    |
|    |    |    |    |    | 3  | 2  | 2   | 1  | 3  |    |    |    |

LC-56 #10, Bit_1(Cell)

FIG. 2C
(CONVENTIONAL ART)

| | | | | | 0 | 3 | 17 | 10 | 2 | | | |
|---|---|---|---|---|---|---|---|---|---|---|---|---|
| | | | | | 9 | 8 | 9 | 14 | 6 | | | |
| | | | | | 5 | 7 | 17 | 17 | 11 | | | |
| | | | | | 10 | 14 | 0 | 0 | 19 | | | |
| | | 0 | 6 | 8 | 18 | 21 | 27 | 17 | 12 | 25 | 36 | 6 |
| | | 12 | 10 | 11 | 15 | 24 | 26 | 19 | 23 | 25 | 19 | 18 |
| | | 7 | 16 | 9 | 22 | 12 | 14 | 27 | 23 | 24 | 25 | 25 |
| | | 7 | 15 | 13 | 13 | 26 | 19 | 22 | 37 | 18 | 41 | 32 |
| | 7 | 14 | 16 | 22 | 10 | 16 | 19 | 13 | 33 | 35 | 28 | 33 | 23 |
| | 10 | 9 | 11 | 14 | 0 | 9 | 21 | 31 | 19 | 33 | 44 | 34 | 27 |
| | 6 | 2 | 15 | 13 | 13 | 24 | 25 | 32 | 21 | 33 | 44 | 44 | 57 |
| | 8 | 12 | 10 | 12 | 12 | 18 | 15 | 31 | 28 | 28 | 40 | 82 | 40 |
| 10 | 5 | 0 | 7 | 15 | 15 | 15 | 14 | 18 | 11 | 16 | 32 | 32 | 34 | 45 |
| 1 | 1 | 3 | 13 | 26 | 18 | 29 | 32 | 25 | 33 | 28 | 41 | NaN | 30 | 31 |
| 0 | 3 | 4 | 8 | 0 | 6 | 22 | 26 | 33 | 17 | 24 | 31 | 34 | 15 | 7 |
| 2 | 0 | 4 | 7 | 14 | 13 | 21 | 33 | 67 | 32 | 38 | 35 | 13 | 71 | 0 |
| | 19 | 2 | 4 | 6 | 19 | 16 | 23 | 35 | 33 | 35 | 18 | 16 | 1 |
| | 0 | 1 | 2 | 5 | 7 | 23 | 20 | 37 | 23 | 25 | 14 | 1 | 0 |
| | 1 | 0 | 3 | 7 | 13 | 11 | 15 | 32 | 18 | 13 | 10 | 0 | 0 |
| | 0 | 10 | 0 | 2 | 5 | 7 | 13 | 19 | 13 | 4 | 0 | 0 | 0 |
| | | 1 | 0 | 34 | 1 | 3 | 6 | 2 | 7 | 4 | 1 | 0 | |
| | | 1 | 0 | 2 | 0 | 3 | 0 | 1 | 1 | 4 | 0 | 1 | |
| | | 32 | 0 | 0 | 2 | 0 | 0 | 0 | 0 | 0 | 2 | 0 | |
| | | 1 | 0 | 0 | 0 | 0 | 2 | 1 | 0 | 11 | 0 | 0 | |
| | | | | | 0 | 0 | 0 | 0 | 0 | | | | |
| | | | | | 0 | 0 | 1 | 0 | 0 | | | | |
| | | | | | 0 | 31 | 0 | 1 | 2 | | | | |
| | | | | | 0 | 0 | 0 | 2 | 2 | | | | |

LC-56 #10, Bit_1(S/A)

| | | | | | | | | | | | | | | |
|---|---|---|---|---|---|---|---|---|---|---|---|---|---|---|
| | | | | | 5 | 3 | 5 | 1 | 4 | | | | | |
| | | | | | 0 | 3 | 0 | 5 | 2 | | | | | |
| | | | | | 1 | 1 | 0 | 2 | 0 | | | | | |
| | | | | | 0 | 2 | 1 | 0 | 3 | | | | | |
| | | 2 | 2 | 7 | 1 | 3 | 4 | 0 | 5 | 2 | 3 | 3 | | |
| | | 2 | 2 | 1 | 1 | 1 | 1 | 0 | 1 | 1 | 1 | 1 | | |
| | | 6 | 0 | 3 | 1 | 0 | 0 | 0 | 2 | 0 | 0 | 8 | | |
| | | 3 | 1 | 5 | 1 | 0 | 1 | 0 | 4 | 2 | 2 | 0 | | |
| | 3 | 4 | 1 | 3 | 5 | 2 | 1 | 1 | 0 | 1 | 3 | 1 | 1 | |
| | 7 | 1 | 0 | 0 | 5 | 0 | 0 | 1 | 1 | 1 | 1 | 2 | 4 | |
| | 9 | 9 | 1 | 3 | 3 | 1 | 1 | 2 | 1 | 5 | 6 | 3 | 1 | |
| | 7 | 2 | 25 | 1 | 3 | 5 | 1 | 1 | 1 | 1 | 0 | 8 | 4 | |
| 11 | 7 | 2 | 3 | 0 | 6 | 0 | 1 | 0 | 1 | 5 | 3 | 4 | 4 | 4 |
| 7 | 8 | 4 | 0 | 4 | 3 | 4 | 21 | 2 | 3 | 2 | 2 | 8 | 3 | 3 |
| 5 | 7 | 2 | 2 | 1 | 3 | 1 | 3 | 0 | 2 | 1 | 2 | 2 | 3 | 3 |
| 12 | 8 | 6 | 5 | 4 | 3 | 2 | 0 | 0 | 2 | 1 | 3 | 2 | 4 | 5 |
| | 2 | 7 | 6 | 6 | 1 | 2 | 1 | 0 | 0 | 2 | 1 | 1 | 4 | |
| | 26 | 3 | 2 | 2 | 4 | 5 | 4 | 3 | 1 | 1 | 0 | 2 | 2 | |
| | 1 | 2 | 2 | 4 | 35 | 4 | 1 | 0 | 1 | 0 | 0 | 0 | 5 | |
| | 17 | 2 | 1 | 4 | 1 | 3 | 3 | 1 | 0 | 3 | 2 | 1 | 11 | |
| | | 1 | 2 | 2 | 2 | 2 | 3 | 0 | 2 | 1 | 1 | 5 | | |
| | | 2 | 4 | 0 | 1 | 3 | 0 | 2 | 0 | 1 | 2 | 4 | | |
| | | 2 | 3 | 4 | 3 | 1 | 1 | 1 | 0 | 4 | 0 | 5 | | |
| | | 3 | 1 | 20 | 5 | 3 | 5 | 2 | 1 | 4 | 3 | 5 | | |
| | | | | | 12 | 0 | 4 | 1 | 2 | | | | | |
| | | | | | 2 | 3 | 1 | 1 | 1 | | | | | |
| | | | | | 2 | 1 | 2 | 1 | 1 | | | | | |
| | | | | | 29 | 8 | 2 | 1 | 26 | | | | | |

LC-56 #01, Bit_1(Cell)

FIG. 6D

|   |   |   |   | 0 | 1 | 0 | 0 | 1 |   |   |   |   |
|---|---|---|---|---|---|---|---|---|---|---|---|---|
|   |   |   |   | 6 | 0 | 0 | 0 | 0 |   |   |   |   |
|   |   |   |   | 0 | 0 | 0 | 0 | 0 |   |   |   |   |
|   |   |   |   | 4 | 0 | 1 | 0 | 0 |   |   |   |   |
|   | 2 | 0 | 0 | 0 | 1 | 0 | 0 | 2 | 0 | 2 | 0 |   |
|   | 1 | 1 | 0 | 4 | 0 | 0 | 0 | 0 | 1 | 0 | 0 |   |
|   | 7 | 2 | 0 | 1 | 2 | 0 | 0 | 0 | 2 | 2 | 2 |   |
|   | 0 | 0 | 4 | 66 | 0 | 63 | 0 | 0 | 2 | 0 | 2 |   |
| 0 | 1 | 2 | 64 | 0 | 2 | 0 | 0 | 0 | 0 | 0 | 0 | 0 |
| 2 | 2 | 0 | 0 | 0 | 1 | 0 | 0 | 0 | 2 | 0 | 2 | 2 |
| 14 | 6 | 1 | 0 | 2 | 0 | 0 | 0 | 0 | 2 | 0 | 2 | 4 |
| 1 | 2 | 4 | 1 | 1 | 0 | 0 | 0 | 0 | 1 | 0 | 0 | 0 |
| 2 | 0 | 1 | 15 | 0 | 0 | 0 | 4 | 0 | 0 | 0 | 4 | 64 | 2 | 2 |
| 0 | 1 | 0 | 64 | 0 | 0 | 0 | 0 | 0 | 64 | 0 | 0 | 1 | 0 | 2 |
| 5 | 0 | 0 | 0 | 0 | 0 | 0 | 0 | 0 | 0 | 0 | 1 | 0 | 1 | 0 |
| 0 | 1 | 1 | 0 | 0 | 0 | 1 | 0 | 0 | 1 | 0 | 4 | 0 | 0 | 0 |
|   | 0 | 1 | 0 | 0 | 0 | 0 | 0 | 0 | 0 | 0 | 2 | 0 | 0 |
|   | 0 | 0 | 0 | 0 | 0 | 1 | 0 | 0 | 0 | 0 | 1 | 2 | 0 |
|   | 0 | 0 | 0 | 32 | 0 | 0 | 2 | 0 | 0 | 0 | 2 | 4 | 0 |
|   | 0 | 0 | 2 | 0 | 0 | 1 | 0 | 0 | 0 | 1 | 3 | 0 | 3 |
|   |   | 0 | 0 | 0 | 0 | 0 | 0 | 0 | 1 | 1 | 3 | 2 |   |
|   |   | 0 | 0 | 0 | 0 | 1 | 0 | 2 | 0 | 0 | 0 | 66 |   |
|   |   | 5 | 0 | 0 | 0 | 2 | 1 | 0 | 0 | 4 | 0 | 4 |   |
|   |   | 0 | 0 | 0 | 0 | 0 | 2 | 0 | 0 | 1 | 5 | 2 |   |
|   |   |   |   | 0 | 0 | 2 | 0 | 0 |   |   |   |   |
|   |   |   |   | 0 | 0 | 1 | 0 | 0 |   |   |   |   |
|   |   |   |   | 1 | 0 | 2 | 0 | 2 |   |   |   |   |
|   |   |   |   | 64 | 0 | 4 | 5 | 0 |   |   |   |   |

LC-56 #01, Bit_1(S/A)

METHOD OF MANUFACTURING A SEMICONDUCTOR DEVICE INCLUDING ALIGNMENT MARK

BACKGROUND OF THE INVENTION

1. Field of the Invention

The present invention relates to a method of manufacturing semiconductor devices. More particularly, the present invention relates to a method of manufacturing semiconductor devices that is capable of reducing defects and pits on a surface of a semiconductor substrate during the manufacturing of the semiconductor devices.

2. Description of the Related Art

Semiconductor manufacturing processes usually include forming isolations for electrically isolating adjacent active devices, such as transistors, in a semiconductor substrate. Among such isolation technologies, a local oxidation of silicon (LOCOS) method is well known. In accordance with the LOCOS method, an isolation commonly known as a field oxide is formed by oxidizing silicon in the semiconductor substrate. The LOCOS method, however, suffers from several problems. Some of these problems will be now described.

First, a bird's beak is formed at side edges of the isolation, thereby making it difficult to secure a desired size of the isolation. While there may be a solution to achieve the desired size of the isolation (i.e., the field oxide), the solution includes performing subsequent processes such as removing the bird's beak after forming the field oxide with the bird's beak, so that the manufacturing processes of the semiconductor device becomes increasingly complicated.

Second, the silicon substrate becomes enlarged at isolation areas during the oxidizing of the substrate. Therefore, a height difference exists between the isolation areas and active areas in which transistors are to be formed. Accordingly, when a polysilicon layer is formed on a semiconductor substrate having the isolations and then patterned to form gate electrodes of the transistors, the height difference causes dispersion of light for photolithography. As a result, a process margin of the photolithography is reduced so that a desired length of the gate electrode is not able to be secured.

Third, electric characteristics of the semiconductor devices formed on a semiconductor substrate having such narrowed isolations are degraded. That is, electric punch through between adjacent active areas may easily occur due to a narrow width of the isolation interposing the adjacent active areas. A narrow width of an isolation means a physically reduced field channel length and thus latch up phenomenon is caused. Latch up causes undesired circuit operations in a logic circuit area in which a plurality of logic circuits are formed and reduces charge retention time in a memory cell area, thereby increasing refresh frequency of the memory cells.

Therefore, as a design rule of a semiconductor device is reduced, the LOCOS method has been replaced with a shallow trench isolation (STI) method from the range of a 0.25 $\mu$m design rule.

In the STI method, the isolations are formed by first forming shallow trenches in a semiconductor substrate, then filling the shallow trenches with an oxide material and planarizing an upper surface of the semiconductor substrate. Accordingly, the planarization process eliminates a step height difference between active areas and isolation areas. That is, the surface of the semiconductor substrate with the isolations is substantially even. Accordingly, a gate electrode can be formed with sufficient process margin. Further, it is relatively easy to secure the desired size of the isolation because a bird's beak is not formed, thereby inhibiting the occurrence of the punch through effect.

A conventional method of manufacturing a semiconductor device will now be described.

FIGS. 1A through 1H illustrate partial cross-sectional views of a semiconductor substrate sequentially showing a conventional method of forming a semiconductor device. The conventional semiconductor device manufacturing method includes an isolation process of the STI method.

Figure 1A:
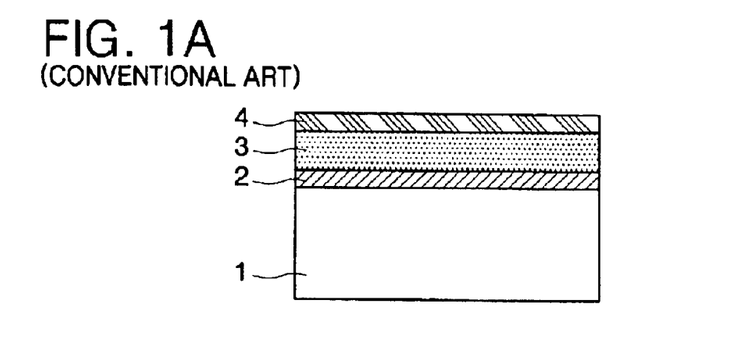
FIGS. 1A through 1H illustrate cross-sectional views of a semiconductor substrate sequentially showing a conventional method of manufacturing a semiconductor device.

Referring to FIG. 1A, a first oxide layer 2 is formed on a semiconductor substrate 1 and then a first silicon nitride layer 3 and an anti-reflection layer 4 are formed on the first oxide layer 2.

Figure 1B:
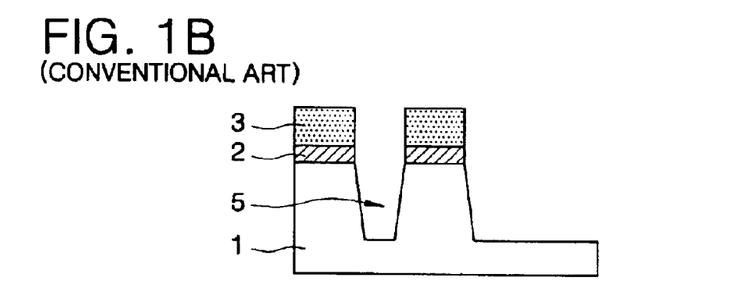

Next, as shown in FIG. 1B, a photolithography process is performed onto the semiconductor substrate 1 to divide the semiconductor substrate into active areas and inactive areas. Then, a trench 5 is formed at an inactive area in the semiconductor substrate by an etching process.

The first oxide layer 2 is formed using a thermal oxidation process and has a thickness of 120 Å. The first oxide layer 2 is formed to reduce lattice defects of the semiconductor substrate during etching the first silicon nitride 3 for forming the trench at the inactive area. The lattice defects are caused by plasma damage during the etching step. The first silicon nitride layer 3 is used as a mask to protect the active areas from being etched. The anti-reflection layer 4 is used to reduce reflectivity of light for photolithography, so that a fine pitch pattern may be achieved.

Figure 1C:
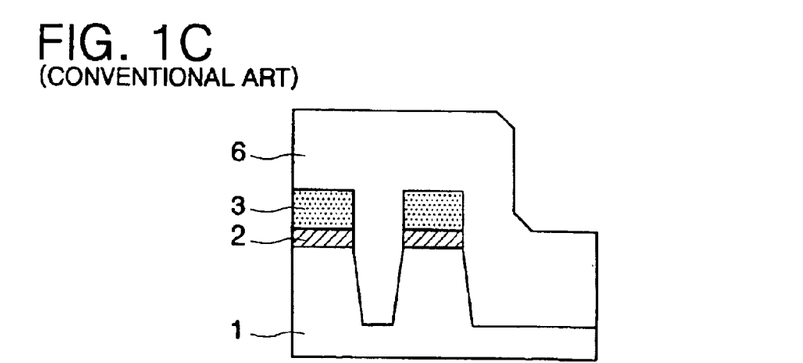

Next, as shown in FIG. 1C, after the trench 5 is formed, sidewalls of the trench 5 are oxidized. A second silicon nitride layer and a hot temperature oxide (HTO) layer (not shown) are deposited in the trench 5, and then a high density plasma (HDP) oxide layer 6 is formed on an entire surface of the semiconductor substrate 1. The oxidation of the sidewalls of the trench 5 is performed to cure any damage to and defects of the semiconductor substrate and to reduce a stress applied to the semiconductor substrate in the trench 5 by the second silicon nitride layer (not shown). The second silicon nitride layer protects the semiconductor substrate by preventing oxidants from permeating into the substrate. The oxidants are generated in the HDP oxide layer 6 filling the trench 5 during a heat treatment process. The HTO layer (not shown) is a buffer layer for protecting the second silicon nitride layer from being etched during the formation of the HDP layer.

Figure 1D:
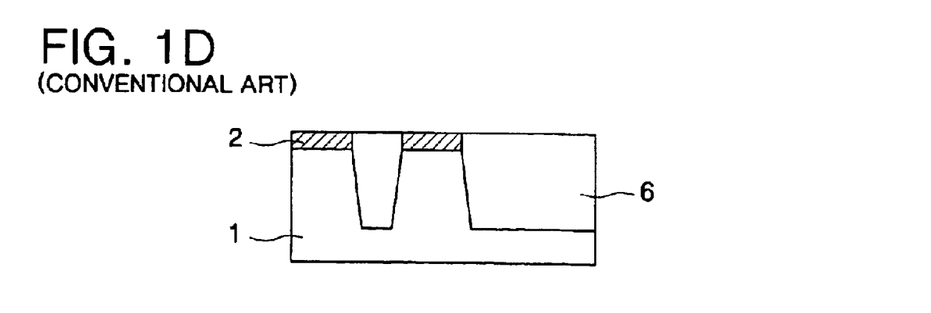

Next, as shown in FIG. 1D, the semiconductor substrate 1 is planarized by a chemical mechanical polishing (CMP) process and the first silicon nitride layer 3 is removed using a wet etching process.

Figure 1E:
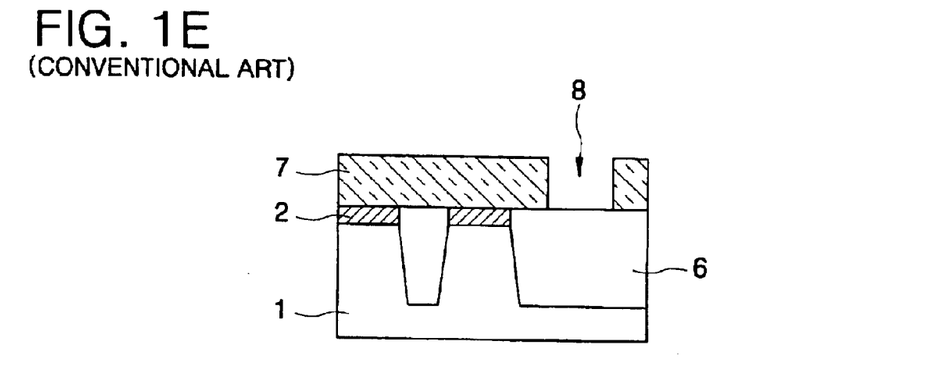

As shown in FIG. 1E, a photoresist layer 7 is formed on an entire surface of the semiconductor substrate and then an opening 8 is formed in the photoresist layer 7 to expose an upper surface of the HDP layer 6. Hereinafter, the formation of the opening 8 is referred to as a key opening step.

Figure 1F:
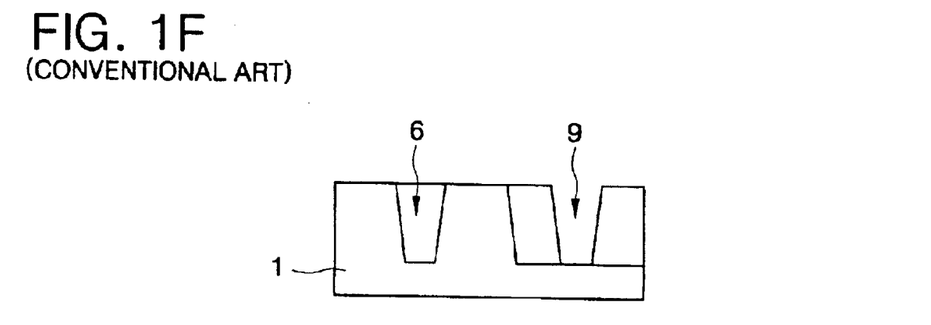

As shown in FIG. 1F, the HDP layer 6 is etched to a predetermined depth through the opening 8 using a dry etching, thereby forming an align key 9 used in a subsequent photolithography process. Then, the first oxide layer 2 on the semiconductor substrate at the active areas is removed using a wet etching process. The align key 9 is formed in a scribe line or other area other than a chip area where semiconductor devices are to be formed in a wafer.

Figure 1G:
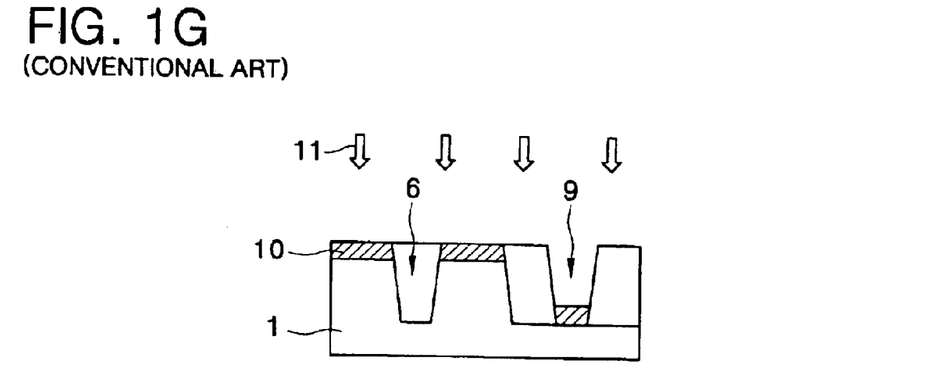

As shown in FIG. 1G, a second oxide layer 10 is formed on an upper surface of the semiconductor substrate 1, and then impurity ions 11 are implanted into the semiconductor substrate. After implanting, the semiconductor substrate is subjected to a rapid thermal annealing (RTA) process.

The second oxide layer 10 is formed using a thermal oxidation process to a thickness of 120 Å to reduce ion implantation damage of the semiconductor substrate during implanting. The RTA process is performed at a temperature of 1050° C. in an $N_2$ gas atmosphere for 30 minutes to excite the impurity ions in the semiconductor substrate and to cure any damage in the semiconductor substrate.

Figure 1H:
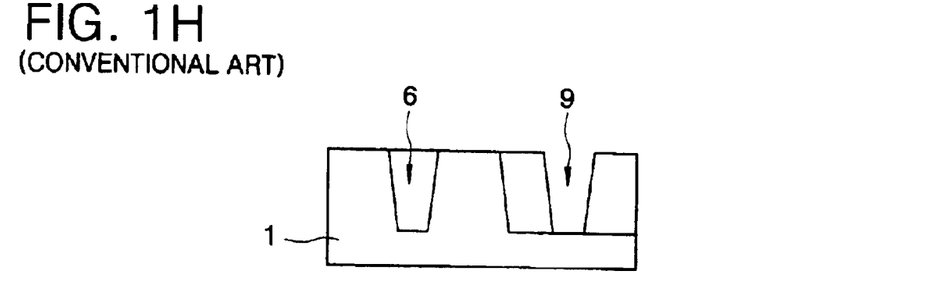

As shown in FIG. 1H, the second oxide layer 10, having been damaged during the ion implantation, is removed using a wet etching process.

In the semiconductor device manufacturing method described above, contaminants, such as metal ions generated during the key opening step, are not completely removed from the semiconductor substrate 1 because the impurities and the metal ions have combined with the first oxide layer 2, which has permeated a lattice defect and normal lattice sites weakened during the trench etching step referred to connection with FIG. 1B, thereby making a by-product or a reaction in the semiconductor substrate 1.

Thereafter, the by-product is grown due to ion implantation and the RTA process. After the wet etching process of the second oxide layer 10, the by-product is removed from the semiconductor substrate 1 and then the lattices with the by-product make pits only at active area in the semiconductor substrate 1. That is, there is a disadvantage in that the conventional method make pits in the semiconductor substrate 1.

Figure 2A:
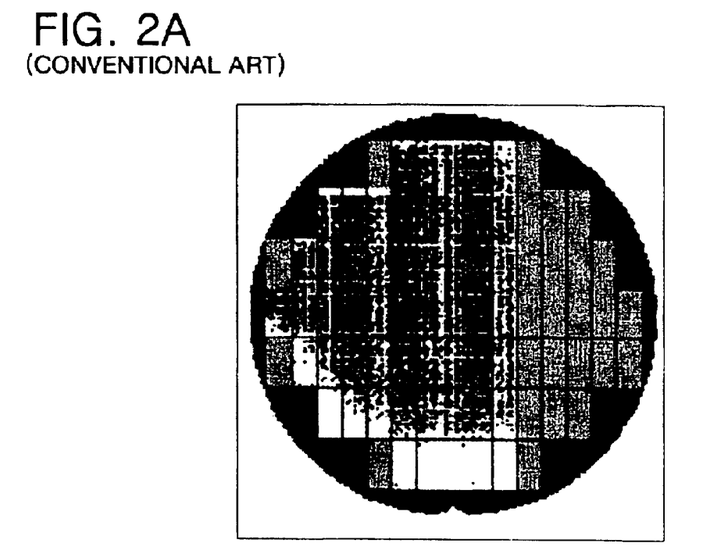
FIG. 2A is a wafer map showing the number of pits formed on a semiconductor substrate after the performance of the processes of FIGS. 1A through 1H.

FIG. 2A is a wafer map showing a dispersion of pits formed on a wafer by a chip. The wafer map in FIG. 2A is acquired after removing the second oxide layer 10 referred to in connection with FIG. 1H.

Figure 2B:
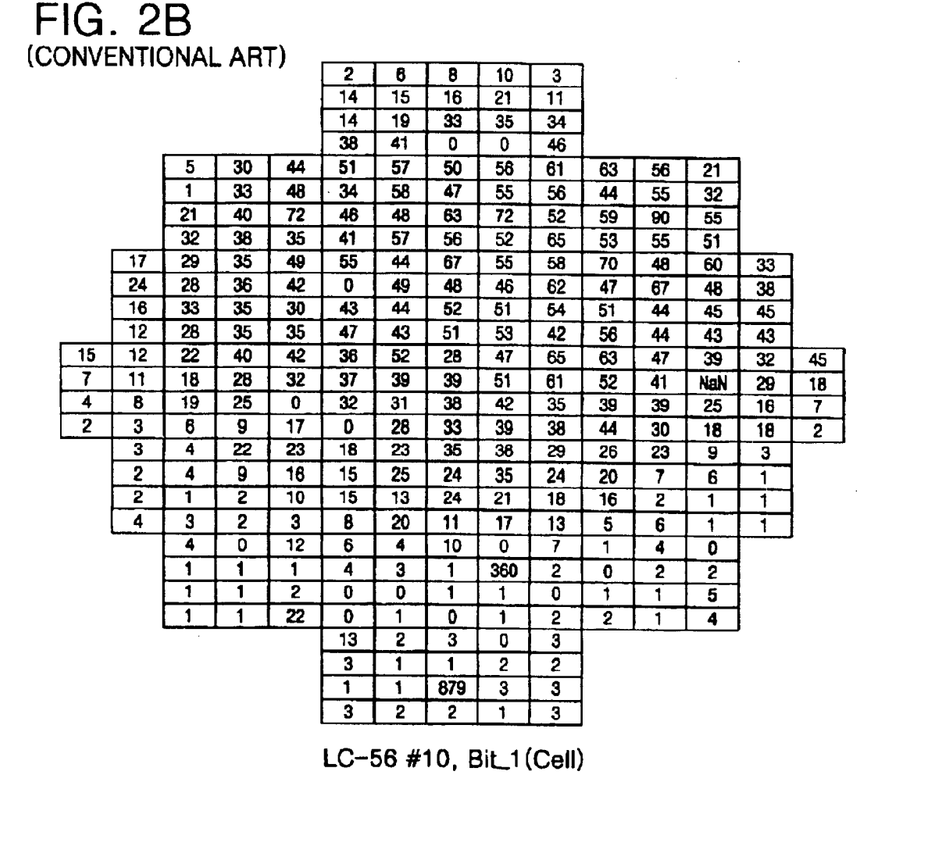
FIGS. 2B and 2C are wafer maps separately showing the numbers of pits in memory cell areas and sense amplifier areas, respectively, in a single wafer after performance of the processes of FIGS. 1A through 1H.
Figure 2C:
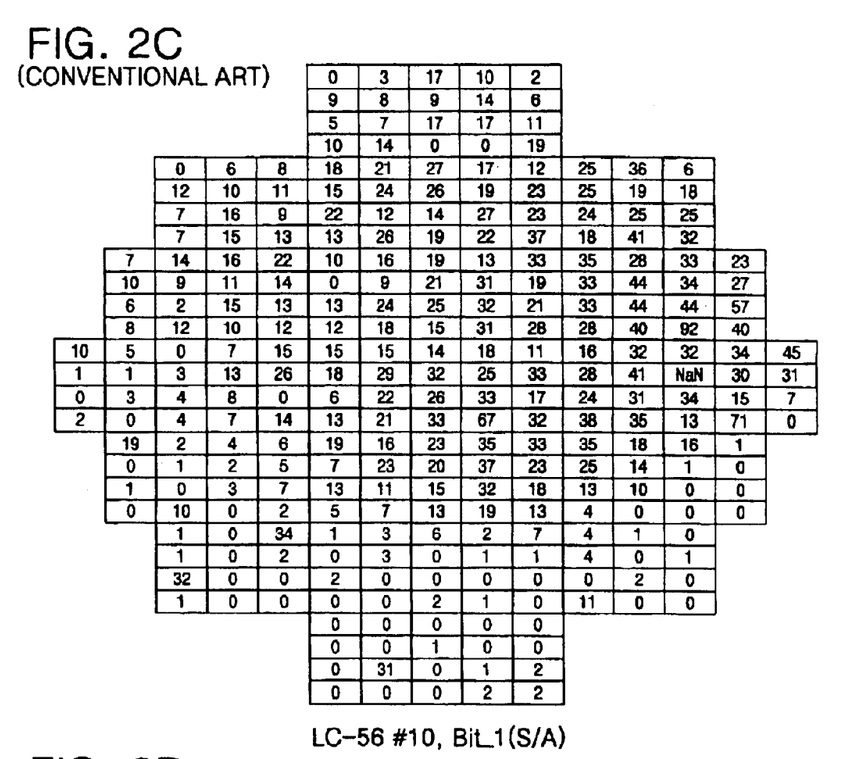

FIGS. 2B and 2C are wafer maps showing the numbers of pits in memory cell areas and sense amplifier areas in a single wafer, respectively. The numerals in the rectangular (chips) indicate the numbers of pits in the memory cell area and the sense amplifier area. As shown in FIGS. 2B and 2C, the number of pits is the greatest at a central portion of the wafer and decreases at points farther away from the center of the wafer.

Figure 2D:
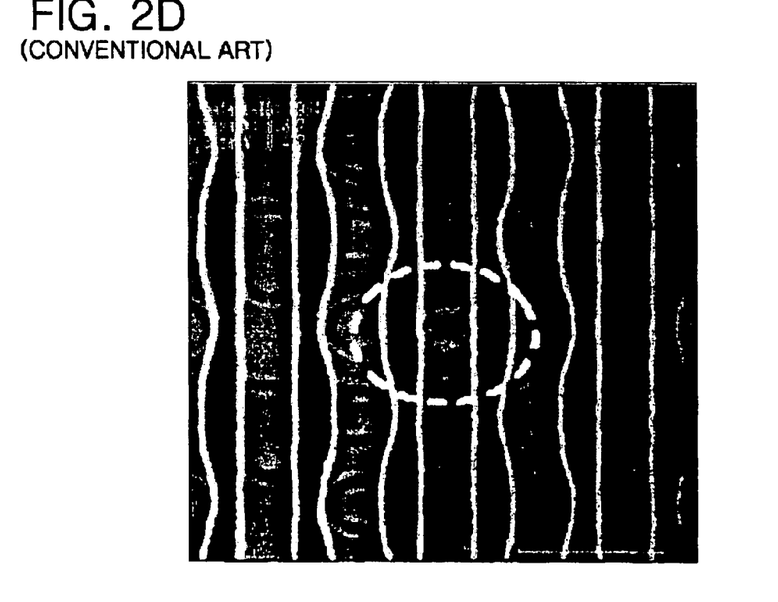
FIG. 2D is a vertical scanning electron microscope (VSEM) photograph showing pits formed on an active area, wherein the photograph is taken after the performance of the processes of FIGS. 1A through 1H.

FIG. 2D is a vertical scanning electron microscope (VSEM) photograph illustrating the pits, the photograph being taken after the second oxide layer is removed. From this VSEM photograph, it may be seen that the pits are formed only on the active areas.

SUMMARY OF THE INVENTION

It is a feature of an embodiment of the present invention to provide a method of manufacturing a semiconductor device, including a key opening step that is performed after a rapid thermal annealing (RTA) process, thereby reducing the occurrence of pits on active areas of a semiconductor substrate.

In accordance with one aspect of the present invention, there is provided a method of manufacturing a semiconductor device, including forming an isolation using a shallow trench isolation (STI) method in a semiconductor substrate, forming an insulation layer on an entire surface of the semiconductor substrate having the isolation, implanting ions into the semiconductor substrate using the insulation layer as a buffer layer, annealing the semiconductor substrate using a rapid thermal annealing (RTA) process, forming a photoresist layer on the insulation layer and then forming an opening in the photoresist layer to expose an underlayer thereof, forming an align key by etching the underlayer at the opening and removing the insulation layer. Preferably, the insulation layer is an oxide layer formed using a thermal oxidation process. Also preferably, the insulation layer is formed to a thickness of about 120 Å.

In accordance with another aspect of the present invention, there is provided a method of manufacturing a semiconductor device, including forming an isolation using a shallow trench isolation (STI) method in a semiconductor substrate, forming a photoresist layer on a first insulation layer remaining from the formation of the isolation and then forming an opening in the photoresist layer to expose an underlayer thereof, forming an align key by etching the underlayer at the opening, removing the photoresist layer and the first insulation layer, forming a second insulation layer on an upper surface of the semiconductor substrate to a thickness of less than 120 Å, implanting ions into the semiconductor substrate using the second insulation layer as a buffer layer, annealing the semiconductor substrate using a rapid thermal annealing (RTA) process, and removing the second insulation layer. Preferably, the second insulation layer is an oxide layer formed using a thermal oxidation method or a deposition process. Also preferably, the second insulation layer is formed to a thickness of less than about 65 Å.

In accordance with yet another aspect of the present invention, there is provided a method of manufacturing a semiconductor device, including forming an isolation using a shallow trench isolation (STI) method in a semiconductor substrate, forming a photoresist layer on a first insulation layer remaining from the formation of the isolation and then forming an opening in the photoresist layer to expose an underlayer thereof, forming an align key by etching the underlayer at the opening, removing the photoresist layer and the first insulation layer, forming a second insulation layer on an upper surface of the semiconductor substrate, implanting ions into the semiconductor substrate using the second insulation layer as a buffer layer, etching an upper portion of the second insulation layer until the thickness of the second insulation layer is reduced to a predetermined thickness, annealing the semiconductor substrate using a rapid thermal annealing (RTA) process, and removing the second insulation layer. Preferably, the second insulation layer is formed to a thickness of between about 65 and 120 Å. Preferably, during the etching of the second insulation layer, the predetermined thickness is less than about 65 Å.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Korean Patent Application No. 2002-8804, filed on Feb. 19, 2002, and entitled: "Method of Manufacturing Semiconductor Device," is incorporated by reference herein in its entirety.

Hereinafter, the present invention will be described in detail by describing preferred embodiments of the present invention with reference to the accompanying drawings. Like reference numerals refer to like elements throughout the drawings. In the drawings, the shape and thickness of an element may be exaggerated for clarity and convenience. Further, it will be understood that when a layer is referred to as being "on" another layer or "on" a substrate, it may be directly on the other layer or on the substrate, or intervening layers may also be present.

FIGS. 3A through 3H illustrate cross-sectional views of a semiconductor substrate sequentially showing a method of manufacturing a semiconductor device in accordance with a first embodiment of the present invention.

Figure 3A:
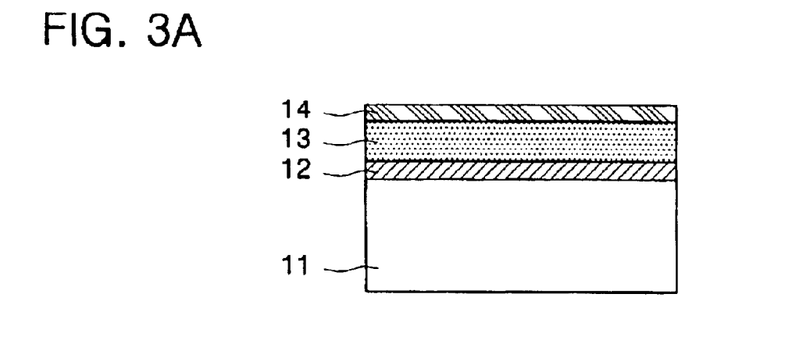
FIGS. 3A through 3H illustrate cross-sectional views of a semiconductor wafer sequentially showing a method of manufacturing a semiconductor device in accordance with a first embodiment of the present invention.

Referring to FIG. 3A, a first oxide layer 12, a first silicon nitride layer 13, and an anti-reflection layer 14 are sequentially stacked on a semiconductor substrate 11.

Figure 3B:
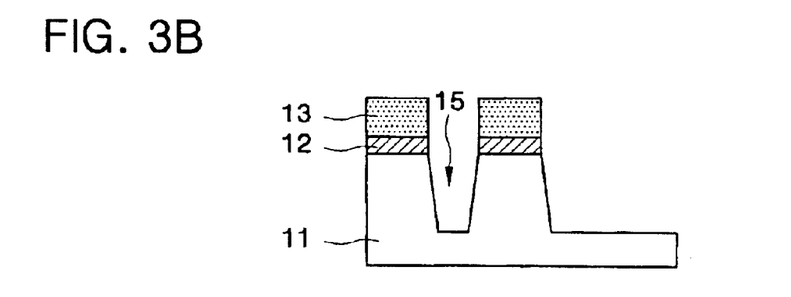

Next, as shown in FIG. 3B, a photolithography process is performed onto the semiconductor substrate 11 to divide the semiconductor substrate into active areas and inactive areas. Then, a trench 15 is formed at an inactive area in the semiconductor substrate using an etching process.

The first oxide layer 12 is preferably formed using a thermal oxidation process and has a thickness of about 120 Å. The first oxide layer 12 is formed to reduce lattice defects of the semiconductor substrate during etching the first silicon nitride 13 for forming the trench at the inactive area. The lattice defects are caused by plasma damage during the etching step. The first silicon nitride layer 13 is used as a mask to protect the active areas from being etched. The anti-reflection layer 14 is used to reduce reflectivity of light for photolithography, so that a fine pitch pattern may be achieved.

Figure 3C:
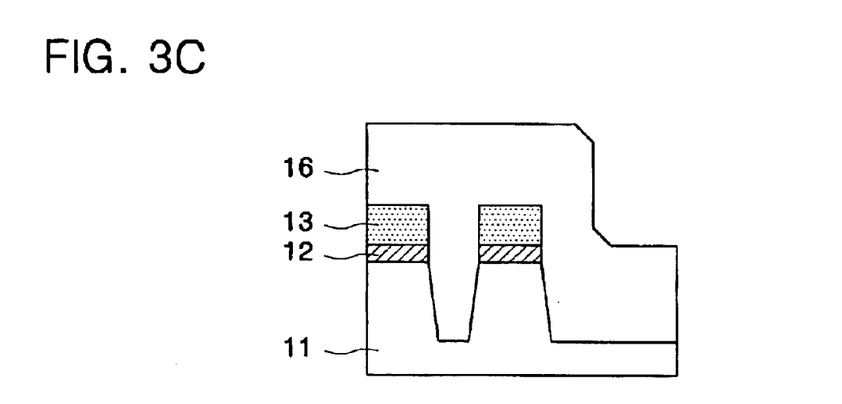

Next, as shown in FIG. 3C, after the trench 15 is formed, sidewalls of the trench 15 are oxidized. A second silicon nitride layer and a hot temperature oxide (HTO) layer (not shown) are deposited in the trench 15, and then a high density plasma (HDP) oxide layer 16 is formed on an entire surface of the semiconductor substrate 11. The oxidation of the sidewalls of the trench 15 is performed to cure any damage to and defects of the semiconductor substrate and to reduce a stress applied to the semiconductor substrate in the trench 15 by the second silicon nitride layer (not shown). The second silicon nitride layer protects the semiconductor substrate by preventing oxidants from permeating into the substrate. The oxidants are generated in the HDP oxide layer 16 filling the trench 15 during a heat treatment process. The HTO layer (not shown) is a buffer layer for protecting the second silicon nitride layer from being etched during the formation of the HDP layer.

Figure 3D:
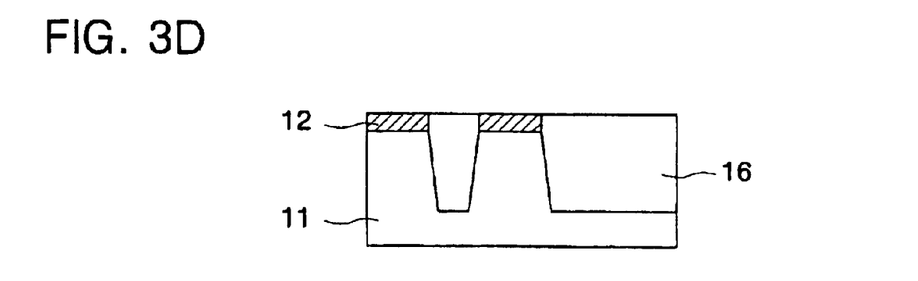

Next, as shown in FIG. 3D, the semiconductor substrate 11 is planarized by a chemical mechanical polishing (CMP) process and the first silicon nitride layer 13 is removed using a wet etching process.

Figure 3E:
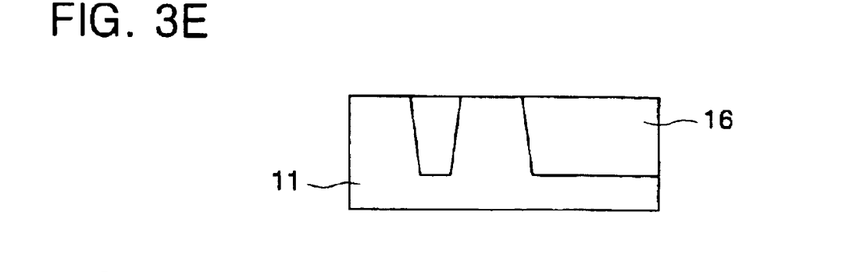

As shown in FIG. 3E, the first oxide layer 12 is removed using a wet etching process. That is, the first oxide layer 12 is removed before the key opening step is performed.

Figure 3F:
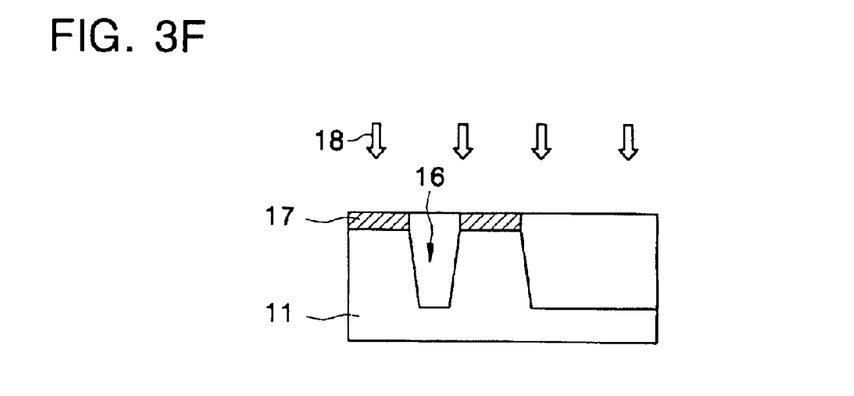

Next, as shown in FIG. 3F, a second oxide layer 17 is formed on an upper surface of the semiconductor substrate 11, and then impurity ions 18 are implanted into the semiconductor substrate 11. After the ion implantation, the semiconductor substrate 11 undergoes a rapid thermal annealing (RTA) process.

The second oxide layer 17 is preferably formed using a thermal oxidation process to a thickness of about 120 Å to reduce ion implantation damage of the semiconductor substrate during implanting. The second oxide layer 17 is a buffer layer for ion implanting. The RTA process is performed at a temperature of 1050° C. in an $N_2$ gas atmosphere for 30 minutes to excite the impurity ions in the semiconductor substrate.

Figure 3G:
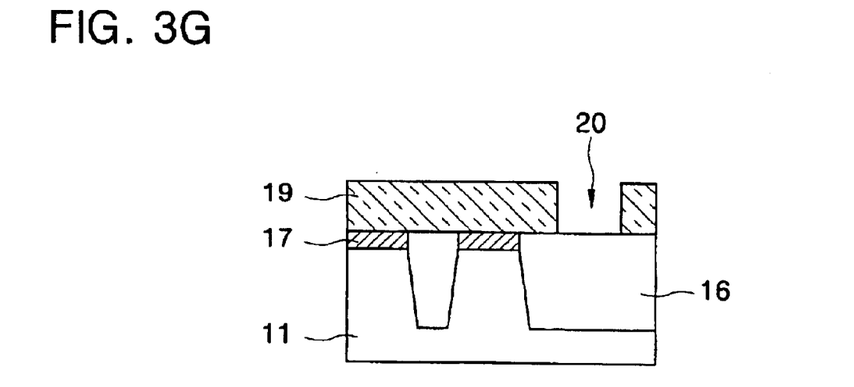

Then, as shown in FIG. 3G, a photoresist layer 19 is formed on an entire upper surface of the semiconductor substrate 11 and then an opening 20 is formed in the photoresist layer 19 to expose a portion of the upper surface of the HDP layer 16.

Figure 3H:
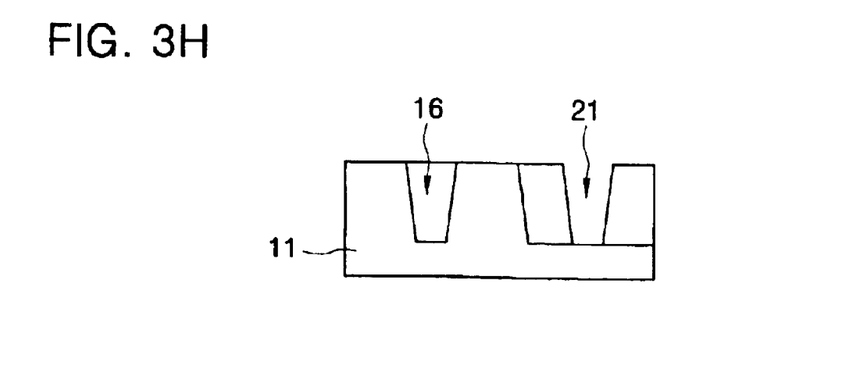

Subsequently, as shown in FIG. 3H, the HDP layer 16 is etched to a predetermined depth through the opening 20 using a dry etching, thereby forming a photo align key 21. Then, the second oxide layer 17 on the semiconductor substrate at the active areas is removed using a wet etching. The photo align key 21 is formed in a scribe line area or other area other than a chip area where semiconductor devices are to be formed in a semiconductor wafer.

In accordance with the first embodiment of the present invention, the key opening step and align key forming step are performed after the RTA process is performed, unlike in the conventional method.

During the RTA process, most defects of the semiconductor substrate are cured. In detail, impurities and metal ions generated during the key opening step and align key forming step are able to permeate the semiconductor substrate 11, thereby making a by-product or a reaction having combined with the second oxide layer 17 in the semiconductor substrate 11. The by-product, however, is not grown from the substrate surface toward a bulk region of the semiconductor substrate 11 as compared with the conventional method because the key opening step and align key forming step are performed after forming the second oxide layer 17, performing the ion implantation 18, and performing the RTA process. Thus, the by-product is completely removed from the semiconductor substrate 11 when the second oxide layer 17 is removed using the wet etching. That is, there is an advantage in that the first embodiment of the present invention method greatly decreases pits in the semiconductor substrate 11.

Figure 4:
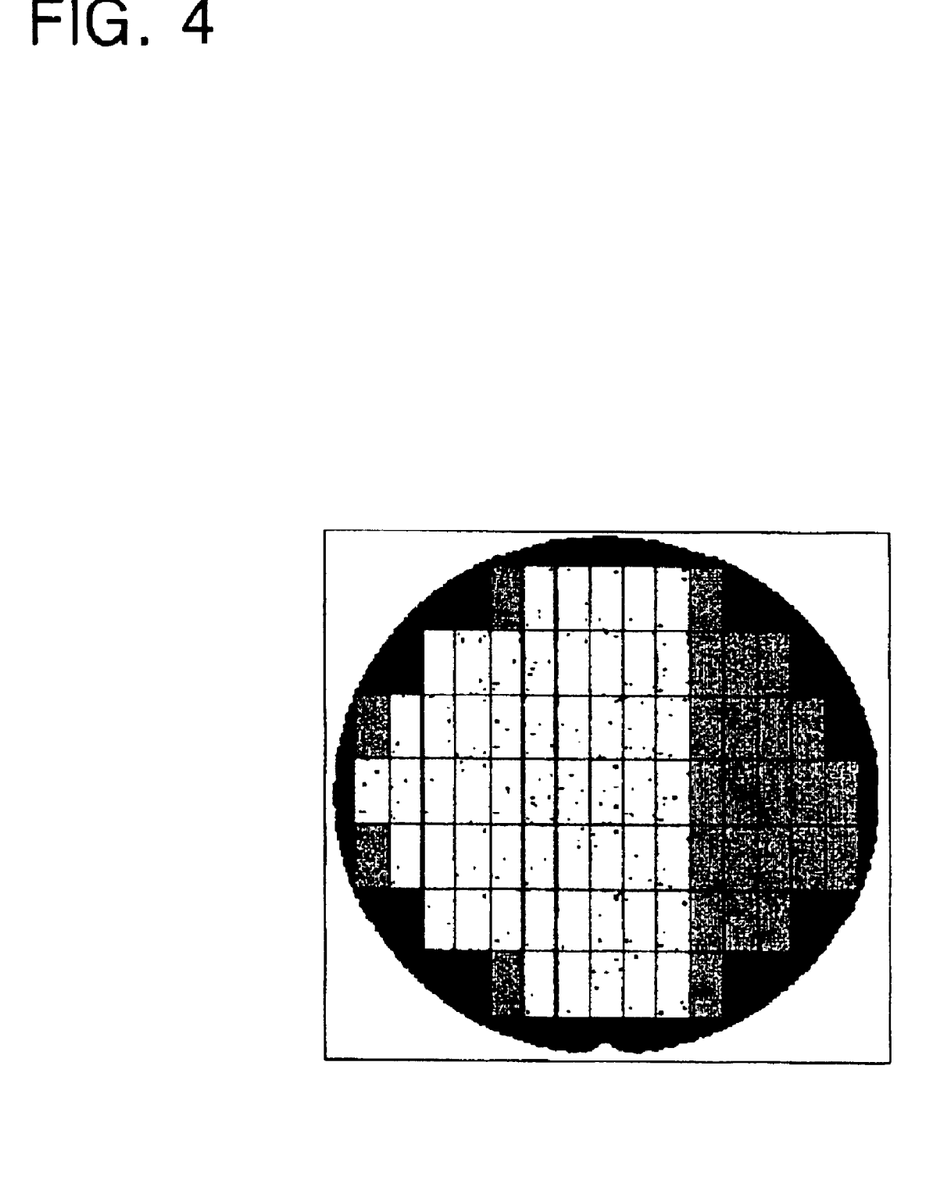
FIG. 4 is a wafer map showing the number and locations of pits on a semiconductor substrate, wherein the wafer map is made after the performance of the steps of FIGS. 3A to 3H.
Figure 5A:
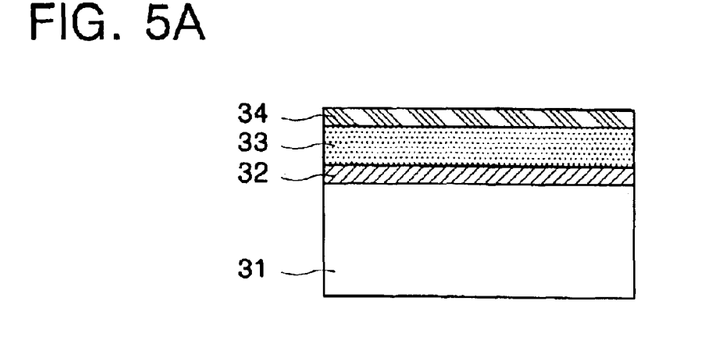
FIGS. 5A through 5H illustrate cross-sectional views of a semiconductor substrate sequentially showing a method of manufacturing a semiconductor device in accordance with a second embodiment of the present invention.
Figure 5B:
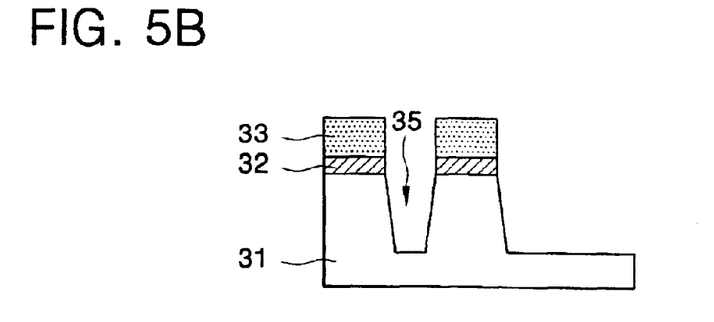
Figure 5C:
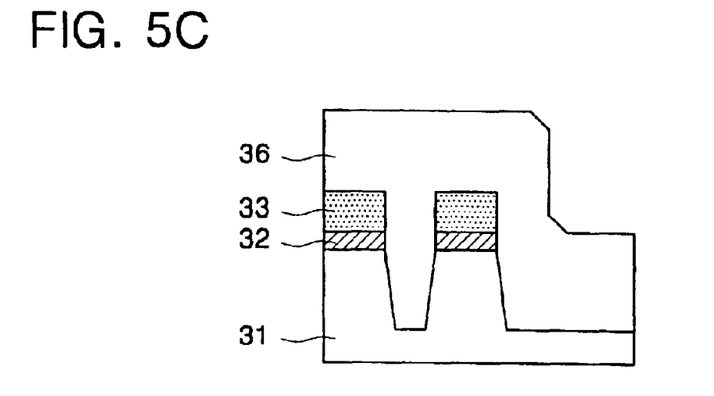
Figure 5D:
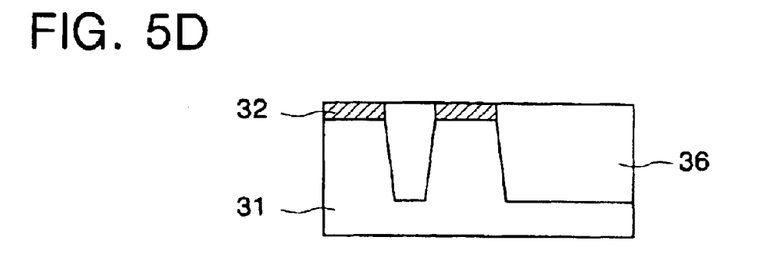
Figure 5E:
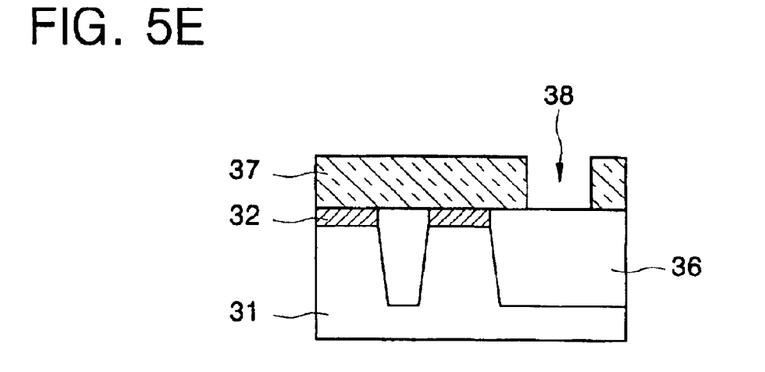
Figure 5F:
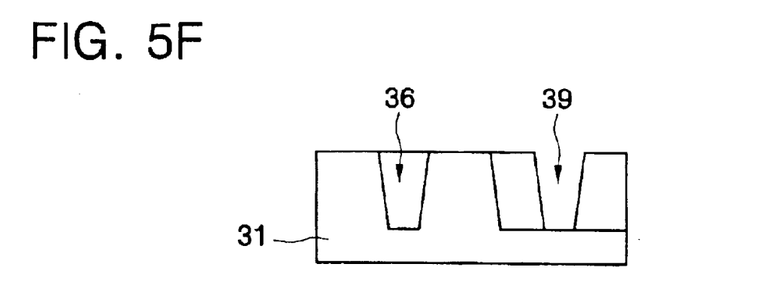
Figure 5G:
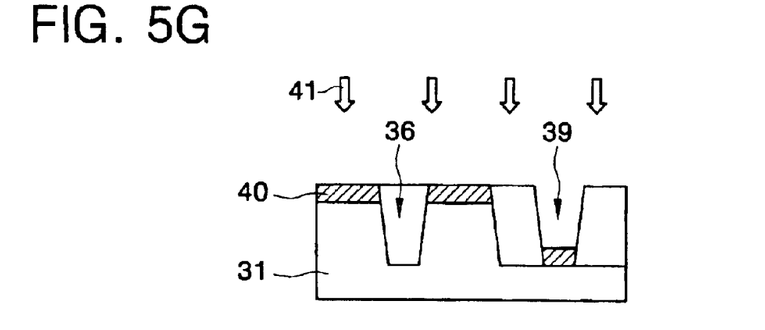
Figure 5H:
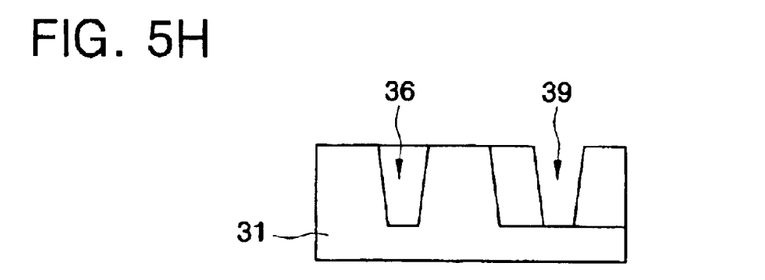

FIG. 4 is a wafer map based on the number and locations of pits formed on the semiconductor chip, the wafer map being made after the second oxide layer 17 is removed in accordance with the first embodiment of the present invention.

As may be seen in FIG. 4, pits are not present. Black points shown in the wafer map do not represent pits, but rather represent particles. A subsequent cleaning process may easily remove these particles.

FIGS. 5A to 5H illustrate cross-sectional views of a semiconductor substrate sequentially showing a method of manufacturing a semiconductor device in accordance with a second embodiment of the present invention.

Stages of the second embodiment of the present invention illustrated in FIGS. 5A to 5H are sufficiently similar to the stages illustrated in FIGS. 1A to 1H that a detailed description of FIGS. 5A to 5F and 5G may be omitted herein. In FIGS. 5A–5H, reference numerals 31, 32, 33, and 34 represent a semiconductor substrate, a first oxide layer, a first silicon nitride layer, and an anti-reflection layer, respectively. Reference numeral 35 indicates a trench, reference numeral 36 indicates an HDP oxide layer, reference numeral 37 represents a photoresist layer and reference numeral 38 represents an opening formed in the photoresist layer 37. Reference numeral 39 represents an align key, reference numeral 40 represents a second oxide layer, and the implantation of impurity ions is represented by reference numeral 41.

The method in accordance with the second embodiment of the present invention differs from the method in accordance with the conventional art in the stage illustrated in FIG. 1G. According to the second embodiment of the present invention, the second oxide layer 40 is formed to a thickness of less than 120 Å in the step of FIG. 5G, whereas the second oxide layer 10 in the FIG. 1G is formed to a thickness of 120 Å. Preferably, the second oxide layer 40 may be formed to a thickness of less than about 65 Å using a thermal oxidation process or a deposition process.

A thickness of less than 120 Å may also be achieved by first forming a second oxide layer to a thickness of 120 Å and then partially wet etching an upper portion thereof until a thickness of the second oxide layer 40 is reduced by a predetermined amount.

Figure 6A:
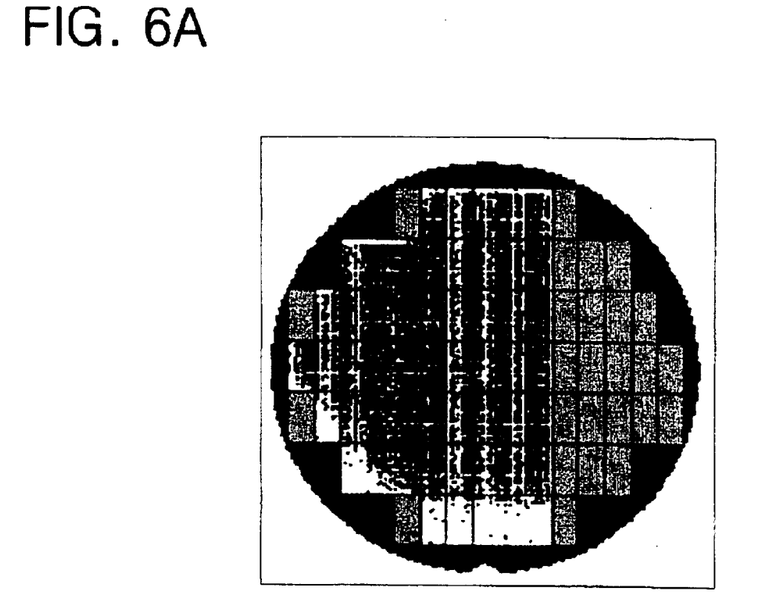
FIGS. 6A to 6D are wafer maps showing the number and locations of pits on the semiconductor substrate, wherein the wafer maps are made after performance of the manufacturing process in accordance with the second embodiment of the present invention.
Figure 6B:
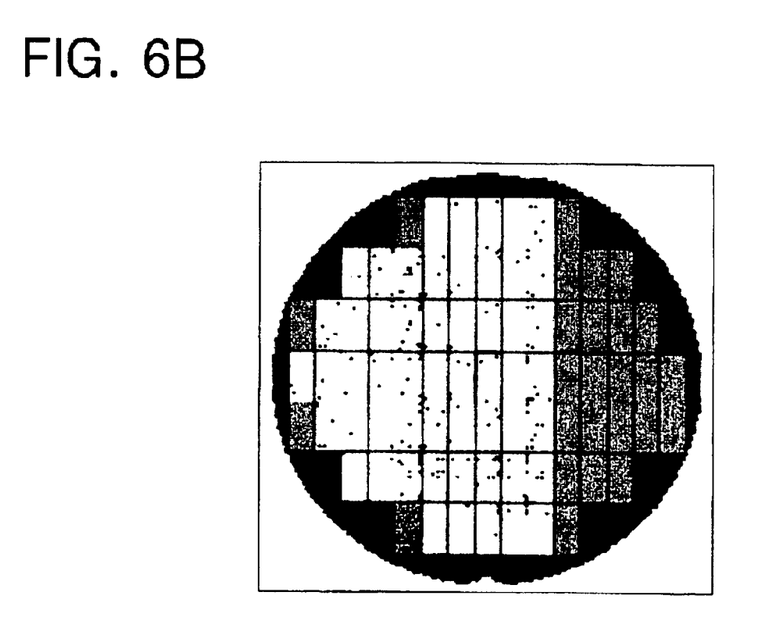

FIGS. 6A and 6B are wafer maps acquired after the performance of the steps illustrated in connection with FIGS. 5A to 5H in which the second oxide layer 40 is formed to a thickness of 85 Å and 63 Å, respectively. As may be seen in FIGS. 6A and 6B, pits are not found in the wafer map of FIG. 6B but pits are found in FIG. 6A. The number of pits that may be seen in FIG. 6B is comparable to an amount that is observed in a conventional semiconductor substrate.

After repeatedly performing the steps of FIGS. 5A to 5G using several different thicknesses of the second oxide layer functioning as a buffer layer for implanting, it is confirmed that the number of pits is greatly decreased when thickness of the second oxide layer is a thickness of less than about 65 Å. Accordingly, in accordance with the present invention, the thickness of the second oxide layer being used as a buffer layer for implanting should be a thickness of less than about 65 Å.

Figure 6C:
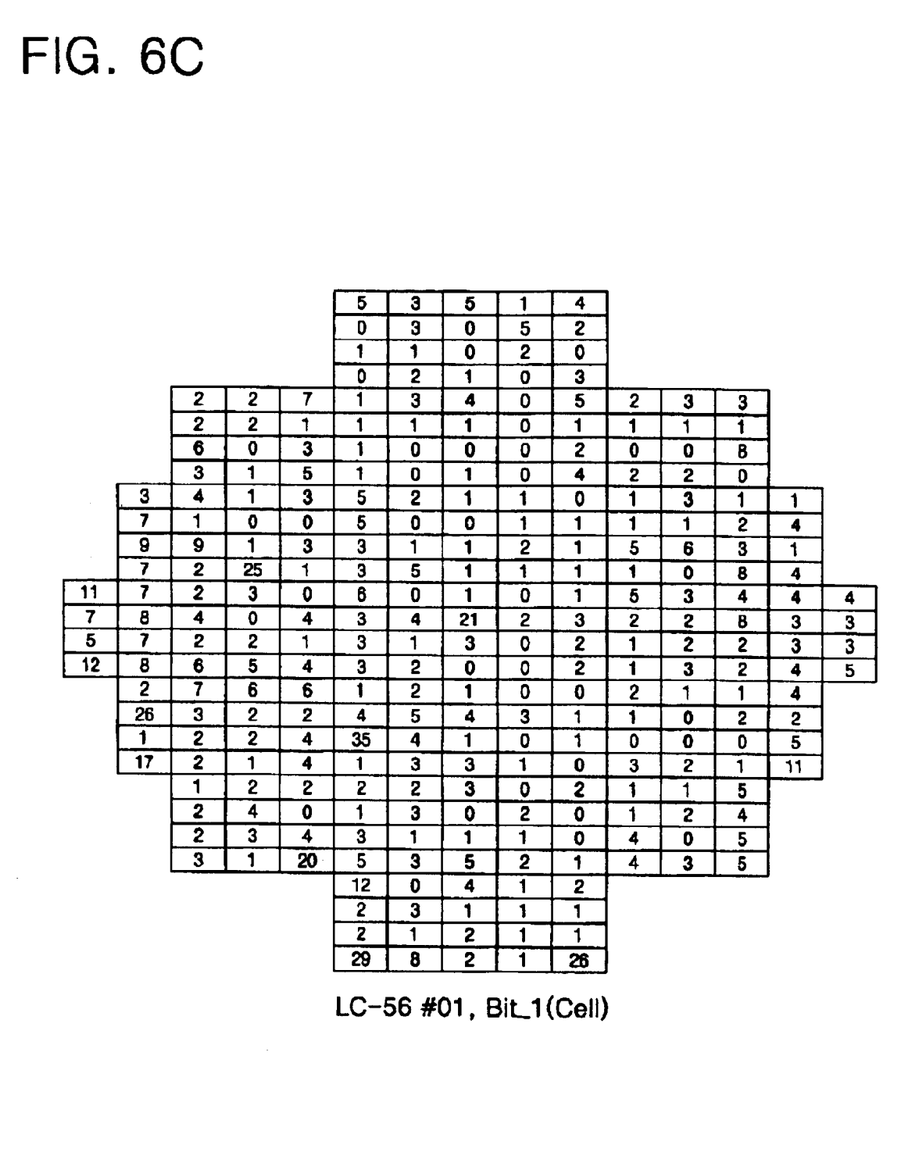
Figure 6D:
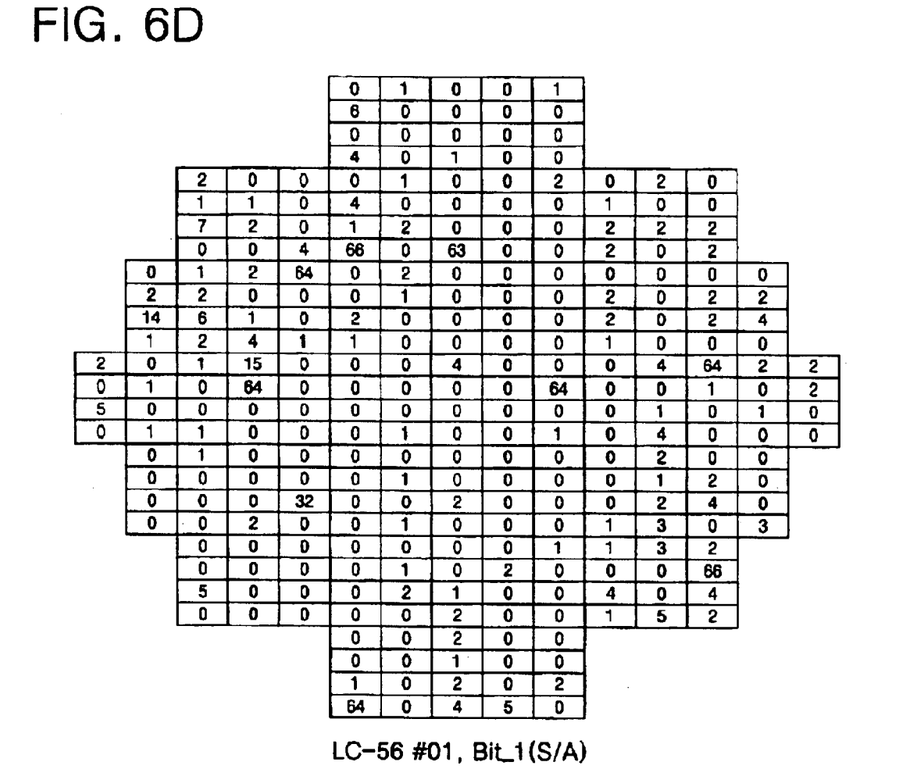

FIGS. 6C and 6D are wafer maps made after performing the steps of FIGS. 5A to 5H in which the second oxide layer 40 is formed to a thickness of about 63 Å. FIGS. 6C and 6D show the number and locations of pits in the memory cell areas and the sense amplifier areas, respectively.

Further, in accordance with yet another embodiment of the present invention, a thickness of about 65 Å may be achieved by forming a second oxide layer to a thickness of 120 Å and then partially wet etching an upper portion thereof before the RTA process is performed.

Figure 7A:
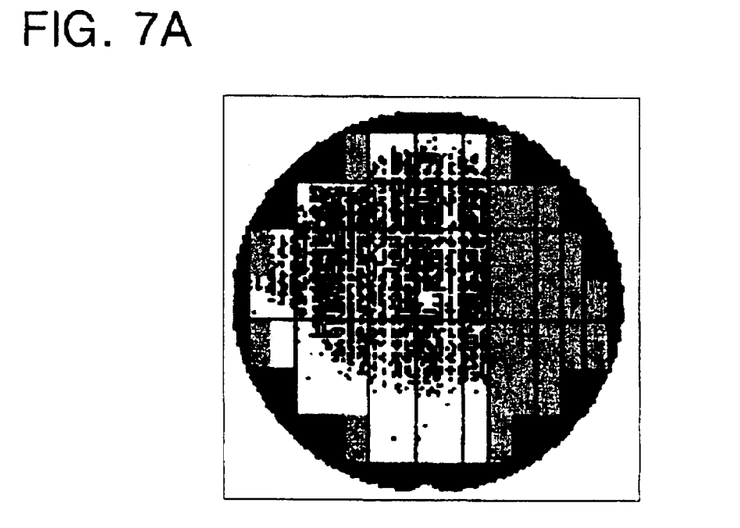
FIGS. 7A to 7C are wafer maps showing the number and locations of pits on the semiconductor substrate that is formed in accordance with a third embodiment of present invention.
Figure 7B:
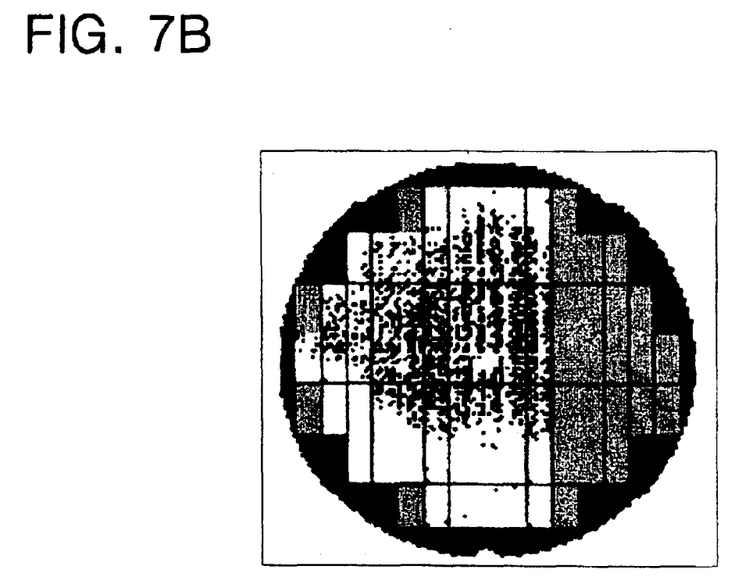
Figure 7C:
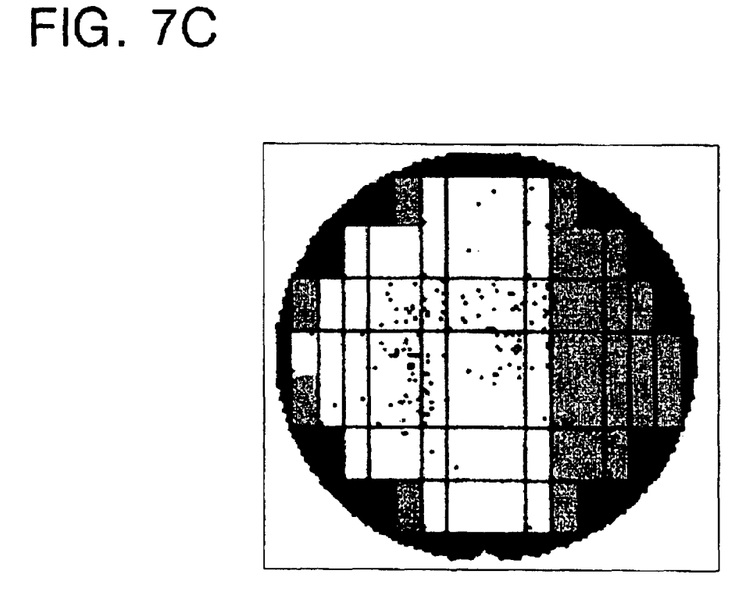

FIG. 7A to FIG. 7C are wafer maps showing the number and locations of pits, wherein a thickness of the second oxide layer is adjusted by increasing wet etching time in the partial wet etching step of the second oxide layer having a thickness of 120 Å. The semiconductor devices in FIG. 7C are formed with longest wet etching time. As may be seen in FIGS. 7A to 7C, the number of the pits decreases as the wet etching time increases.

It appears that a thinner oxide layer reduces physical stress applied to a semiconductor substrate as compared to a thicker oxide layer. As a result, the least number of pits is shown in FIG. 7C, which has the thinnest oxide layer of FIGS. 7A–7C.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device, comprising:
    forming an isolation using a shallow trench isolation (STI) method in a semiconductor substrate;
    forming an insulation layer on an entire surface of the semiconductor substrate having the isolation;
    implanting ions into the semiconductor substrate using the insulation layer as a buffer layer;
    annealing the semiconductor substrate using a rapid thermal annealing (RTA) process;
    after annealing the semiconductor substrate, forming a photoresist layer on the insulation layer and then forming an opening in the photoresist layer to expose an underlayer thereof;
    forming an align key by etching the underlayer at the opening; and
    removing the insulation layer.

2. The method according to claim 1, wherein the insulation layer is an oxide layer formed using a thermal oxidation process.

3. The method according to claim 1, wherein the insulation layer is formed to a thickness of about 120 Å.

4. A method of manufacturing a semiconductor device, comprising:
    forming an isolation using shallow trench isolation (STI) method in a semiconductor substrate;
    forming a photoresist layer on a first insulation layer raining from the formation of the isolation and then forming an opening in the photoresist layer to expose an underlayer thereof;
    forming an align key by etching the underlayer at the opening;
    removing the photoresist layer and the first insulation on layer;
    forming a second insulation layer on an upper surface of the semiconductor substrate;
    implanting ions into the semiconductor substrate using the second insulation layer as a buffer layer;

etching an upper portion of the second insulation layer until the thickness of the second insulation layer is reduced to a predetermined thickness;

after etching the second insulation layer, annealing the semiconductor substrate using a rapid thermal annealing (RTA) process; and removing the second insulation layer.

5. The method according to claim 4, wherein the second insulation layer is formed to a thickness of less than about 65 Å.

6. The method according to claim 4, wherein during the etching of the upper portion of the second insulation layer, the predetermined thickness is less than about 65 Å.

* * * * *